United States Patent
Zhang et al.

(10) Patent No.: US 8,093,951 B1
(45) Date of Patent: Jan. 10, 2012

(54) PULSE-WIDTH MODULATED (PWM) AUDIO POWER AMPLIFIER HAVING OUTPUT SIGNAL MAGNITUDE CONTROLLED PULSE VOLTAGE AND SWITCHING FREQUENCY

(75) Inventors: Lingli Zhang, Austin, TX (US); Dan Shen, Austin, TX (US); Johann Gaboriau, Austin, TX (US); Eric J. Swanson, Buda, TX (US)

(73) Assignee: Cirrus Logic, Inc., Austin, TX (US)

( * ) Notice: Subject to any disclaimer, the term of this patent is extended or adjusted under 35 U.S.C. 154(b) by 81 days.

(21) Appl. No.: 12/568,667

(22) Filed: Sep. 28, 2009

Related U.S. Application Data (60) Provisional application No. 61/168,968, filed on Apr. 14, 2009.

(51) Int. Cl.
  *H03F 3/217* (2006.01)
  *H03F 3/04* (2006.01)
(52) U.S. Cl. ........................ 330/251; 330/297
(58) Field of Classification Search ............... 330/10, 330/207 A, 251, 297
  See application file for complete search history.

(56) References Cited

U.S. PATENT DOCUMENTS

| | | | |
|---|---|---|---|
| 4,873,493 A | 10/1989 | Fujiwara | |
| 5,289,137 A | 2/1994 | Nodar et al. | |
| 5,442,317 A | 8/1995 | Stengel | |
| 6,104,248 A | 8/2000 | Carver | |
| 6,304,138 B1 | 10/2001 | Johnson | |
| 6,586,992 B1 | 7/2003 | Strakovsky | |
| 6,636,103 B2 | 10/2003 | Wurcer et al. | |
| 6,683,494 B2 * | 1/2004 | Stanley | 330/10 |
| 7,023,269 B2 * | 4/2006 | Meng et al. | 330/10 |
| 7,031,457 B2 | 4/2006 | Melsa | |

(Continued)

FOREIGN PATENT DOCUMENTS

DE 19858963 A1 7/2000
(Continued)

OTHER PUBLICATIONS

Willis, et al., "First All-Digital Amplifier?", Stereophile press release, Jan. 8, 1998, [online], [retrieved on Jul. 22, 2009], Retrieved from the Internet: <URL:http://www.stereophile.com/news/10077/index.htm>.
Quilter, Patrick "Amplifier Anatomy", QSC Audio Products, published in Sound & Video Contractor Feb. 20, 1993.

*Primary Examiner* — Robert Pascal
*Assistant Examiner* — Khiem Nguyen
(74) *Attorney, Agent, or Firm* — Andrew M. Harris; Mitch Harris, Atty at Law, LLC (57) ABSTRACT

An audio switching power amplifier having an output pulse voltage selected in conformity with an indication of the output signal amplitude provides lower electromagnetic interference (EMI) in class-D amplifier implementations, in particular, in inductor-less designs. The output pulse voltage may be selected by providing multiple switching circuits, such as half or fully bridge switches, with each switching circuit connected to a different power supply. One of the switching circuits is activated by the switching controller, while the others are disabled, providing selection of the output pulse voltage. Selection of a lower pulse voltage, when the maximum voltage is not required, reduces the generated EMI. The switching frequency of the class-D amplifier may also be controlled in conformity with the output signal amplitude, so that at higher output levels a lower switching rate is selected, reducing the generated EMI.

10 Claims, 5 Drawing Sheets

U.S. PATENT DOCUMENTS

| | | | |
|---|---|---|---|
| 7,078,964 B2 * | 7/2006 | Risbo et al. | 330/10 |
| 7,183,857 B2 | 2/2007 | Doy et al. | |
| 7,312,654 B2 * | 12/2007 | Roeckner et al. | 330/10 |
| 2008/0044041 A1 | 2/2008 | Tucker et al. | |
| 2008/0144861 A1 | 6/2008 | Melanson et al. | |

FOREIGN PATENT DOCUMENTS

| | | |
|---|---|---|
| DE | 10140285 A1 | 2/2003 |
| GB | 2360410 A | 9/2001 |

* cited by examiner

PULSE-WIDTH MODULATED (PWM) AUDIO POWER AMPLIFIER HAVING OUTPUT SIGNAL MAGNITUDE CONTROLLED PULSE VOLTAGE AND SWITCHING FREQUENCY

The present U.S. patent application claims priority under 35 U.S.C. §119(e) to U.S. Provisional Patent Application 61/168,968 filed on Apr. 14, 2009.

BACKGROUND OF THE INVENTION

1. Field of the Invention

The present invention relates generally to integrated circuit switching power amplifiers, and more specifically, to a pulse-width modulated (PWM) power amplifier in which the pulse voltage and/or switching frequency are dependent on output signal amplitude.

2. Background of the Invention

Audio power output stage amplifiers consume the bulk of the wasted power in an audio system. In analog amplifiers, the difference between the voltage of the power supply rails and the voltage of the output signal is a voltage drop that determines the wasted power in combination with the instantaneous load current. Raising the efficiency of power amplifiers has typically been performed in one of two ways: either controlling the voltage of the power supply rails of a linear amplifier so that the power supply voltage is reduced when signal levels are low enough to permit such reduction, in so-called class-G and class-H amplifiers, or using switching power amplifiers in which output current is provided by pulses having only the duration needed to raise the output voltage to the necessary output level.

Pulse-width modulated (PWM) switching power amplifiers, referred to as class-D amplifiers, are currently in widespread use in automotive amplifiers and other audio amplifiers. Class D amplifiers are switching power amplifiers and as mentioned above, have higher efficiency than linear amplifiers, making them well suited for battery driven applications and applications where power dissipation in the form of heat is a problem, such as very high power professional audio applications, as in concert halls. However, the electromagnetic interference (EMI) generated by class-D amplifiers can be substantial, in contrast to that of linear amplifiers, in which generated EMI is almost nonexistent.

Because the output transducers driven by audio power amplifiers, e.g., speakers or headphones, provide filtering of the audio output, a class-D power amplifier can be connected directly to a transducer without a series output inductor, in configurations referred to as inductor-less designs. However, since the connection to a transducer is frequently a substantial length of wiring, and high frequency components of unfiltered switching pulses are therefore present on the wiring, the EMI generated by an inductor-less design is generally substantially greater than the EMI generated by designs including an inductor.

Therefore, it would be desirable to provide a switching power amplifier generating reduced EMI. It would further be desirable to provide an inductor-less switching power amplifier having reduced EMI.

SUMMARY OF THE INVENTION

The above stated objective of providing a switching power amplifier producing reduced EMI, among others, is achieved in a switching power amplifier and its method of operation.

The switching power amplifier has a selectable output voltage (pulse voltage), and optionally a selectable switching frequency. The selection of the output voltage is made in conformity with an indication of the desired output signal amplitude, which may be a volume control level or a measurement of the input signal level. The voltage of the pulses is decreased during periods of low output signal levels, which reduces the EMI generated by the amplifier. The output voltage selection can be made by providing multiple switching circuits, such as full or half-bridge circuits. The multiple switching circuits are connected to different power supply voltages, and are selectively enabled to determine which power supply is used to generate the pulses.

The switching frequency of the switching power amplifier may be reduced when higher levels of output voltage are selected, indicating a higher level output signal. Any noise or distortion introduced by the lower switching rate will be masked by the higher amplitude output signal, and the lower pulse rate at the amplifier output serves to reduce EMI during periods when the higher pulse voltage is generally selected to generate the higher amplitude output signal.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses a pulse-width modulated (PWM) audio switching power amplifier circuit and method of operation in which an indication of the output signal amplitude: either a volume control value that is applied to the input signal or a detected signal level, is used to control the pulse voltage provided to the output of the amplifier. At lower output signal levels, the power supply voltage can be reduced, which generates a lower level of electromagnetic interference (EMI), especially in inductor-less applications in which the wires connecting the amplifier to the transducer have pulse waveforms. The switching frequency of the power amplifier may also be controlled in conformity with the indication of the output signal amplitude, so that when higher voltage pulses are generated on the amplifier output, a lower switching frequency is used. The lower switching frequency reduces EMI by reducing the number of pulses generated over a given interval, and thus the energy level of the generated EMI. Since signal distortion is less noticeable at higher output levels, the switching frequency can be reduced substantially from that used at lower signal levels, while still producing an acceptable audio output.

Figure 1:
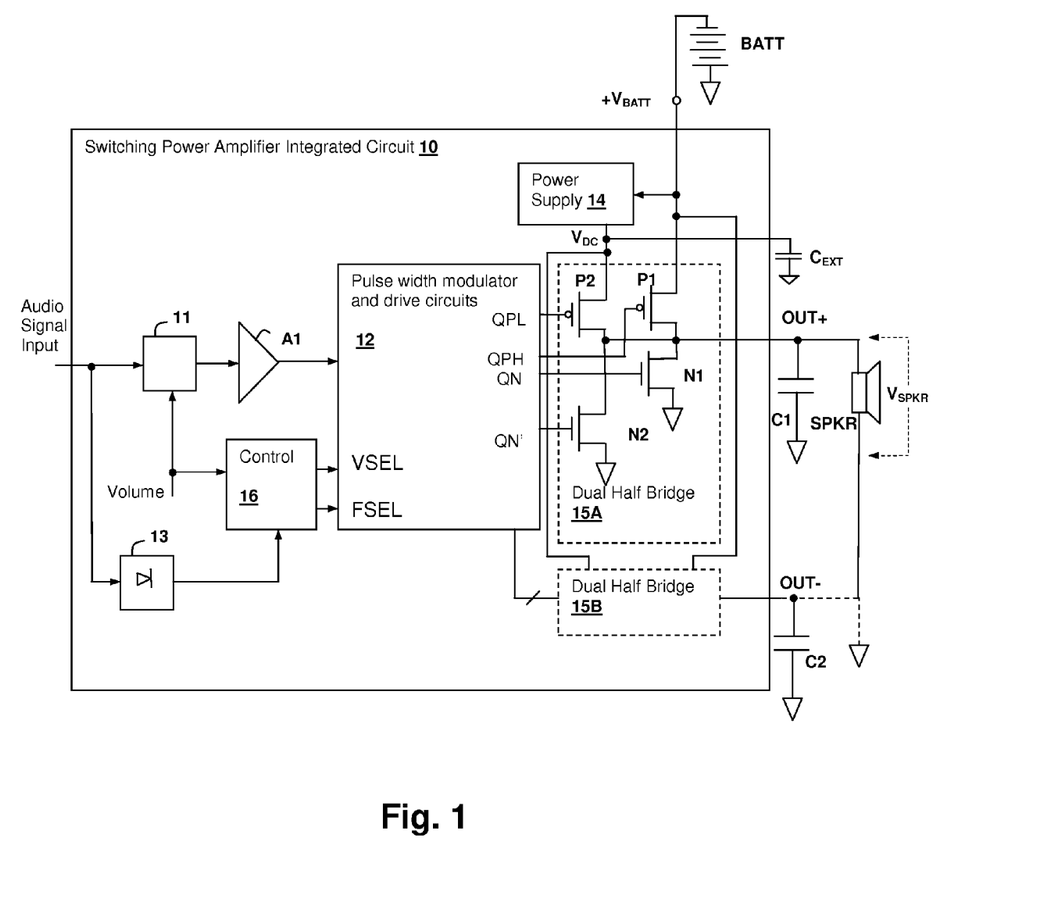
FIG. 1 is a schematic diagram depicting a switching power amplifier circuit in accordance with an embodiment of the present invention.

Referring now to the figures, and in particular to FIG. 1, an audio switching power amplifier integrated circuit 10 is shown, in accordance with an embodiment of the present invention. Switching power amplifier integrated circuit has an input terminal for receiving a voltage source $+V_{BATT}$, which in the illustrated example is supplied from a battery BATT. A transducer, which in the depicted embodiment is a speaker SPKR, but which may be another form of audio transducer, such as headphones or earbuds, is connected to outputs of audio switching power amplifier integrated circuit 10, which deliver audio power output signals OUT+,OUT− in the form of pulse waveforms to speaker SPKR. Capacitors C1 and C2 are optional, and assist in reducing EMI generated by the pulses on output signals OUT+,OUT−. Audio switching power amplifier integrated circuit 10 receives an analog audio input signal or a digital audio input value at terminal Audio Signal Input, and converts the audio waveform represented by the input signal or value to a pulse-width modulated signal in a pulse width modulator and drive circuits block 12.

Drive signal outputs QN, QN', QPH and QPL generated by pulse width modulator and drive circuits block 12 operate transistors N1, N2, P1 and P2, included in dual half-bridge circuit 15A, respectively. Similar drive signals are provided to corresponding transistors in an optional dual half-bridge circuit 15B, which is included to provide optional full-bridge operation. In the depicted embodiment, transistors N1, N2, P1 and P2 are included within audio switching power amplifier integrated circuit 10. However, the present invention includes embodiments in which the switching transistors are external to a controller integrated circuit 10, as the depicted embodiment is understood to be exemplary and not limiting. While the embodiments illustrated herein show "push-pull" configurations for half bridges 15A and 15B, it is understood that the present invention applies equally to full-bridge configurations and that "push-push" (N-N or P-P) half or full-bridge configurations may also be employed. Also, while the depicted embodiment shows an inductor-less audio switching power amplifier configuration, the present invention is applicable to audio switching power amplifier circuits having an external inductor connected in series between an amplifier output and the transducer.

A signal or value received at terminal Audio Signal Input is attenuated or amplified according to a volume control value Volume, i.e., the value that sets the gain/attenuation to be applied to the signal or value, by a gain/attenuation block 11. Another amplifier A1 amplifies the value or signal, which is then provided to pulse width modulator and drive circuits block 12. A signal level detector 13 may be included to determine the amplitude of the signal or value received at terminal Audio Signal Input, and either one or both of volume control value Volume or the output of signal level detector 13 are provided to control circuit 16, which provides control signals VSEL and FSEL to pulse width modulator and drive circuits block 12 to set the voltage and optionally the frequency of the pulses provided by audio switching power amplifier integrated circuit 10 to speaker SPKR.

Dual half-bridge circuits 15A and 15B each receive two power supply voltages: a direct connection from battery BATT provided to transistor P1 and a different voltage provided from an output $V_{DC}$ of a power supply 14, which may be a lower voltage or a higher voltage than input voltage $V_{BATT}$. A terminal is provided on integrated circuit 10 for connection of a filter capacitor $C_{EXT}$ for filtering/decoupling output $V_{DC}$ of power supply 14. When signal level detector 13 or volume control amount Volume indicate that the desired signal level at speaker SPKR is below a threshold value, a lower supply voltage is selected for generating the pulses at outputs OUT+, OUT− of switching power amplifier integrated circuit 10. When signal level detector 13 or volume control amount Volume indicate that the desired signal level at speaker SPKR is above a threshold value, a higher supply voltage is selected for generating the pulses at outputs OUT+,OUT− of switching power amplifier integrated circuit 10. Selection between the power supply voltage is provided in the dual half-bridge circuits 15A, 15B in which individual half-bridges within dual half-bridge circuits 15A, 15B are enabled/disabled by pulse width modulator and drive circuits block 12 according to the state of control signal VSEL. Only one of transistors P2 or P1 is operated for a given power supply level selection, so that pulses having a voltage determined by input voltage $V_{BATT}$ are generated in one selection state by controlling drive signal QPH according to the pulse-width modulated version of the signal or value received at terminal Audio Signal Input, and completely disabling transistor P2 by setting drive signal QPL to its higher-voltage control state. If two transistors N1 and N2 are provided in dual half-bridge circuits 15A and 15B, then corresponding control signal QN is controlled according to the pulse-width modulated version of the signal or value received at terminal Audio Signal Input to switch transistor N1, and transistor N2 is disabled by setting control signal QN' to its lower-voltage control state. However, in an alternative embodiment of the invention, transistor N2 may be omitted and transistor N1 is operated in both voltage selection states according to the pulse-width modulated version of the signal or value received at terminal Audio Signal Input, since the pulse voltage can be selected entirely by enabling/disabling transistors P1 and P2. Providing a half-bridge directly connected to input voltage $V_{BATT}$ permits the pulse voltage at amplifier outputs OUT+,OUT− to be within one transistor voltage drop of input voltage $V_{BATT}$, which can be a substantial efficiency improvement for low voltage operation, and also allows for higher power output in implementations in which input voltage $V_{BATT}$ is the highest voltage input to half-bridge circuits 15A and 15B.

In a second selection state, pulses having a voltage determined by the voltage at output $V_{DC}$ of power supply 14 are generated by controlling drive signal QPL according to the pulse-width modulated version of the signal or value received at terminal Audio Signal Input, and completely disabling transistor P1 by setting drive signal QPH to its higher-voltage control state. If two transistors N1 and N2 are provided in dual half-bridge circuits 15A and 15B, then corresponding control signal QN' is controlled according to the pulse-width modulated version of the signal or value received at terminal Audio Signal Input to switch transistor N2, and transistor N1 is disabled by setting control signal QN to its lower-voltage control state.

Irrespective of whether power supply 14 raises or lowers input voltage $+V_{BATT}$, drive signals QPL, QPH, QN and QN' are enabled and disabled such that the higher pulse voltage is selected when higher audio output levels are provided to speaker SPKR and the lower pulse voltage is selected when lower audio output levels are provided to speaker SPKR. The resulting operation lowers EMI by lowering the amplitude of the pulses when signal levels permit, which reduces the energy associated with each pulse edge transition by the difference of the squares of the pulse voltages, since the energy associated with a step in voltage is proportional to the square of the magnitude of the step in voltage. Further, multiple threshold levels and pulse voltage levels are supported by adding additional half-bridges to dual half-bridge circuits 15A and 15B and providing additional outputs from power supply 14, with only one of the half-bridges enabled for a given output signal level range. It is noted that power supply 14 does not need to be a high efficiency power supply to provide a high overall efficiency for audio switching power amplifier integrated circuit 10. Since audio switching power amplifier integrated circuit 10 is a PWM (Class-D) switching power amplifier, current is conducted to speaker SPKR only when needed to generate the desired output voltage $V_{SPKR}$. Therefore, if power supply 14 is a lower-efficiency type, such as a linear regulator, any loss in power supply 14 will be present only during the duration of the pulses and not continuously, as in comparable linear (non-switching) amplifiers, e.g., class-G and class-H amplifiers having signal level controlled power supply inputs.

Control signal FSEL generated by control circuit 16 is optionally present, and is used to select the frequency of the PWM pulses generated by pulse width modulator and drive circuits block 12 that control dual half-bridge circuits 15A and 15B. Selection of the frequency may be made by changing a division ratio of a counter/divider within pulse width modulator and drive circuits block 12 or by changing the frequency of an oscillator that provides the basis for pulse timing within pulse width modulator and drive circuits block 12. The frequency of the pulses is lowered when a higher pulse voltage level is selected, and control signal FSEL can be the same control signal as control signal VSEL, so that when control signal VSEL selects higher voltage output pulses, control signal FSEL selects a lower pulse frequency. By lowering the frequency of the pulses, EMI is reduced by reducing the number of pulses produced in a given interval. The state of control signal FSEL can alternatively be selected by a different threshold audio signal level than the threshold used to select the state of control signal VSEL, so that, for example, a lower pulse rate is selected at output signal amplitudes lower than those required to trigger the higher output pulse voltage selection. Selecting a lower switching frequency generally increases distortion in the output signal, but distortion is less noticeable at higher signal levels, permitting the present invention to provide low distortion outputs at lower signal levels and permit higher distortion (with lower generated EMI) at higher signal levels.

Figure 2:
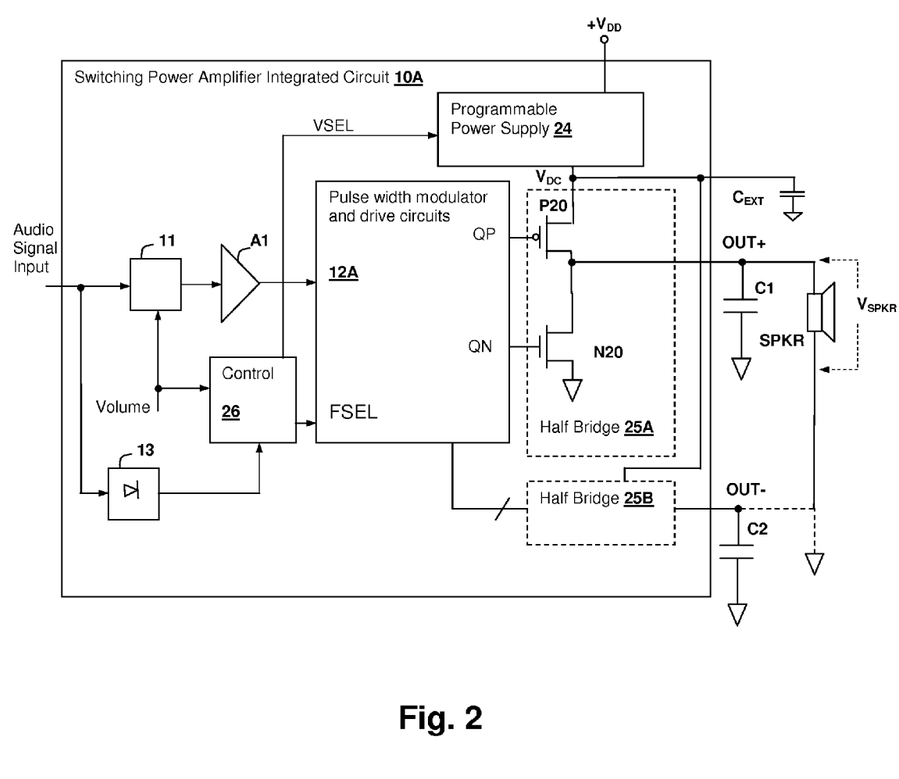
FIG. 2 is a schematic diagram depicting a switching power amplifier circuit in accordance with another embodiment of the present invention.

Referring now to FIG. 2, an audio switching power amplifier integrated circuit 10A is shown, in accordance with an alternative embodiment of the present invention. Audio switching power amplifier integrated circuit 10A is similar to audio switching power amplifier integrated circuit 10 of FIG. 1, and therefore only differences between them will be described below. In audio switching power amplifier integrated circuit 10A, the output of a pulse width modulator and drive circuits block 12 operates single half-bridge circuit 25A and optionally another single half-bridge circuit 25B to form an optional full bridge. Transistors P20 and N20 of half-bridge circuit 25A, and similar transistors within half-bridge circuit 25B generate pulses at outputs OUT+ and −OUT of switching power amplifier integrated circuit 10A in response to drive signals QN and QP connected to half-bridge circuit 25A and other corresponding drive signals provided to half-bridge circuit 25B.

A control circuit 26 receives the volume control value Volume and/or an output of signal level detector 13 as in audio switching power amplifier integrated circuit 10 of FIG. 1, but in audio switching power amplifier integrated circuit 10A, voltage selection control signal VSEL is sent to a programmable power supply 24 to set the output voltage $V_{DC}$ of programmable power supply 24. Therefore audio switching power amplifier integrated circuit 10A uses only a single half-bridge for each output, but provides no direct connection to power supply input +$V_{DD}$ from the output stage, as output $V_{DC}$ of programmable power supply 24 provides the source voltage for all output pulses. Therefore, at least an additional transistor voltage drop is present at outputs OUT+ and OUT− in audio switching power amplifier integrated circuit 10A over that of audio switching power amplifier integrated circuit 10 of FIG. 1. Frequency selection control signal FSEL is provided to pulse width modulator and drive circuits block 12A as in audio switching power amplifier integrated circuit 10 of FIG. 1.

Figure 3:
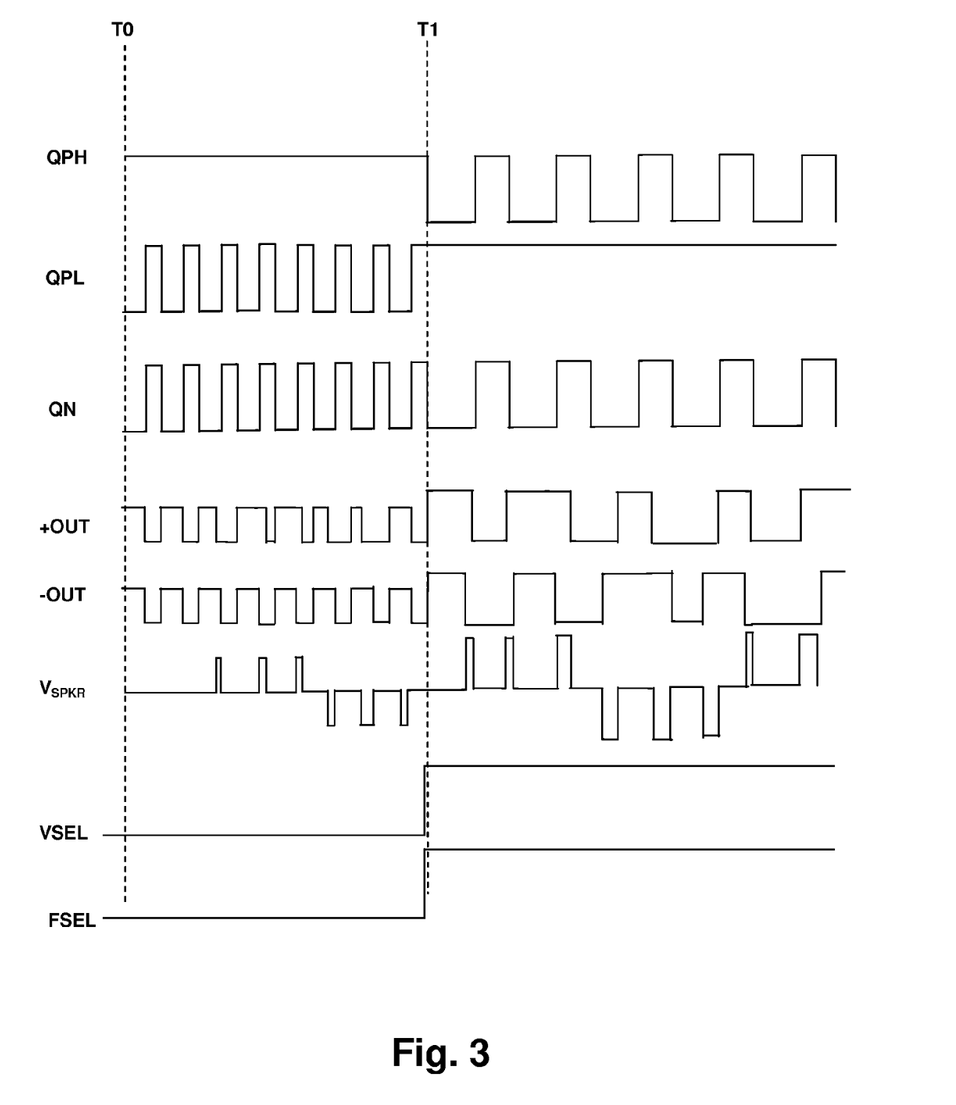
FIG. 3 is a signal waveform diagram depicting signals within the circuits depicted in FIGS. 1-2.

Referring now to FIG. 3, signals within the switching power amplifier circuit of FIG. 1 are illustrated. From time T0 to time T1 control signals VSEL and FSEL are both in a logical low state, indicating that the output signal level needed from the amplifier is lower than a threshold. Drive signals QPL and QN are actively switched according to the output of pulse width modulator and drive circuits block 12, and in the depicted embodiment, only a single N-channel transistor N1 is present, and transistor N2 is omitted. At time T1, either volume control value Volume has increased or the input signal level has increased, causing control signals VSEL and FSEL to enter a logical high state, indicating that the output signal level needed from the amplifier is greater than the threshold. At time T1, the rate of the drive signal pulses provided on drive signal QN increases, drive signal QPL enters a high voltage state to turn off transistor P1, and drive signal QPH begins switching to provide higher voltage pulses on output signals OUT+ and OUT−, which are at a lower rate due to the action of control signal FSEL. Output voltage $V_{SPKR}$, which is the voltage across speaker SPKR, is the difference between the voltages of output signals OUT+ and OUT−. Output signals OUT+ and OUT− as depicted in FIG. 3 represent signals generated in the inductorless class-D amplifiers of FIG. 1 and FIG. 2, in which the switching components of output signals OUT+ and OUT− are in phase with respect to each other. Therefore, when signals OUT+ and OUT− are presented across speaker SPKR, output voltage $V_{SPKR}$ has little or no net switching component. Any switching component that is present is due to differences in the finite resistance of the switching transistors in dual half bridges 15A,15B of FIG. 1 or half bridges 25A,25B of FIG. 2.

Figure 4:
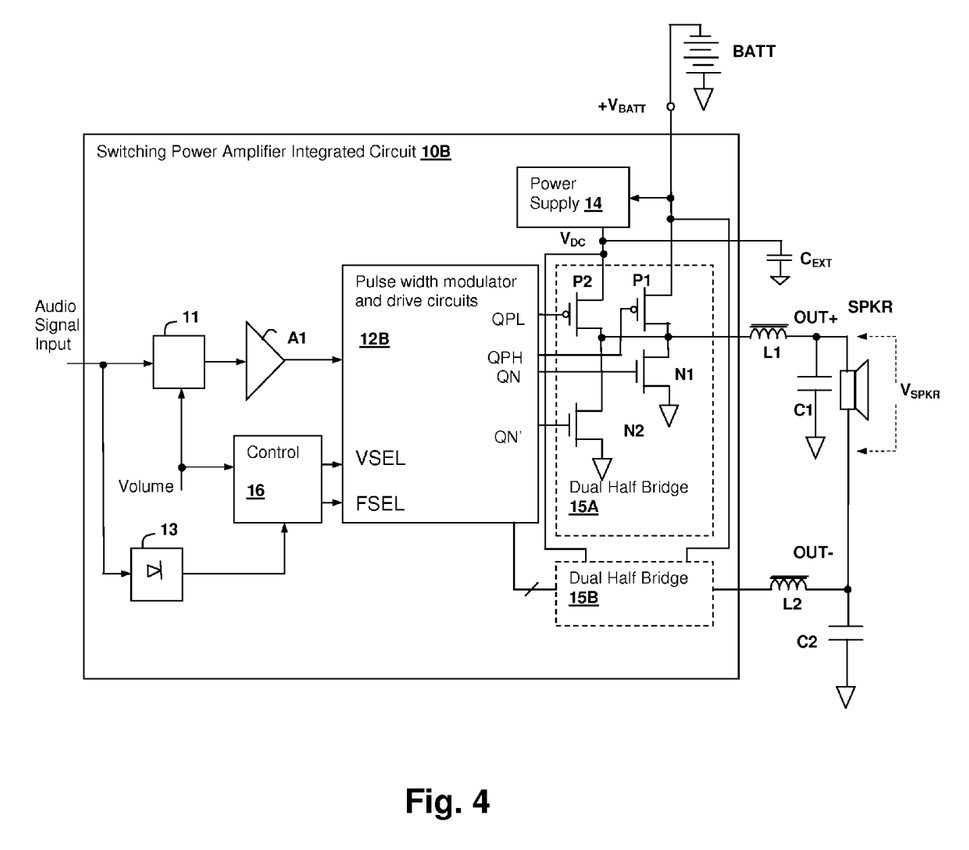
FIG. 4 is a schematic diagram depicting a switching power amplifier circuit in accordance yet with another embodiment of the present invention.

Referring now to FIG. 4, an audio switching power amplifier integrated circuit 10B is shown, in accordance with another alternative embodiment of the present invention. Audio switching power amplifier integrated circuit 10B is similar to audio switching power amplifier integrated circuit 10 of FIG. 1, and therefore only differences between them will be described below. The class-D power amplifier circuit of FIG. 4 illustrates a configuration including inductive filters and is otherwise the same as class-D of FIG. 1, and with the switching action of pulse width modulator and drive circuits block 12B, which provides outputs OUT+ and OUT− to have their switching components generated out of phase with respect to each other. However, the inductor/filter type amplifier configuration illustrated in FIG. 4 can also be provided with an amplifier circuit as illustrated in FIG. 2 and the particular type of output pulse voltage (and optionally frequency) selection is not limited by whether or not the amplifier uses inductive output filters. In audio switching power amplifier integrated circuit 10B, inductors L1 and L2 are provided between outputs OUT+ and OUT− of switching power amplifier integrated circuit 10B and capacitors C1 and C2 to filter the resulting output voltage $V_{SPKR}$ generated across speaker SPKR.

Figure 5:
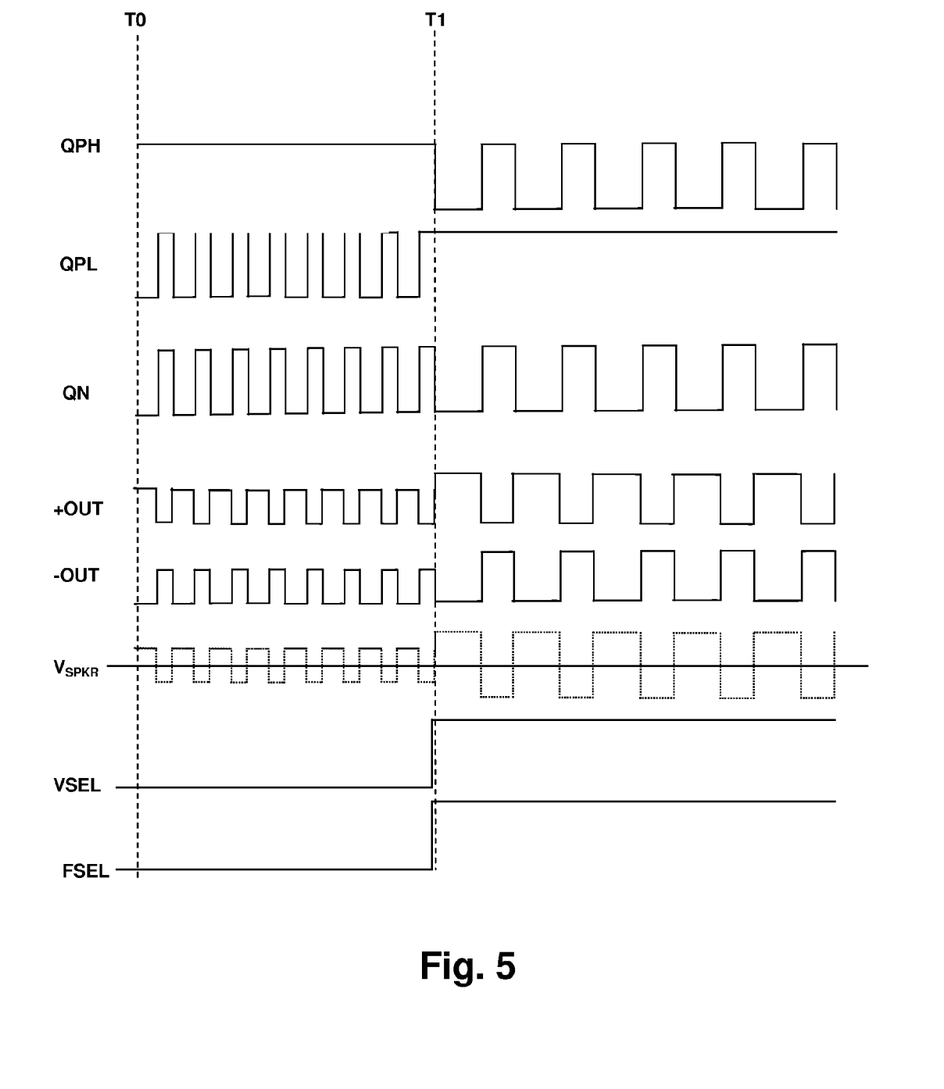
FIG. 5 is a signal waveform diagram depicting signals within the circuit depicted in FIG. 4.

Referring also to FIG. 5, signals within the switching power amplifier circuit of FIG. 4 are illustrated. The waveforms depicted in FIG. 5 are similar to those of FIG. 3 except for the pulses on output signals OUT+ and OUT−, which have switching components out of phase with each other as generated by pulse width modulator and drive circuits block 12B of integrated circuit 10B. Inductors L1 and L2, along with capacitors C1 and C2 and the impedance of speaker SPKR, filter output signal $V_{SPKR}$ so that the switching components are attenuated substantially. The circuit of FIG. 4 could be operated with the switching components of output signals OUT+ and OUT− in or out of phase, but it is advantageous to operate with their switching components out of phase for reduction of noise, and in particular transients generated on the power supply input(s). Output signal $V_{SPKR}$ is shown as solid line with the unfiltered differential shown as a dotted line toggling above and below the level of $V_{SPKR}$ which in the illustration is shown as a zero DC level.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. An audio amplifier circuit for providing an output signal to an audio transducer in response to an audio input signal, said audio amplifier circuit comprising:
   a pulse-width modulator for generating a pulse-width modulated version of the output signal from a representation of the audio input signal, the pulse-width modulator having an output stage with multiple power supply inputs having a voltage determinative of the amplitude of pulses generated by the pulse-width modulator output stage, and wherein the pulse-width modulator is responsive to one or more selection signals to select a selected one of the multiple power supply inputs to set the amplitude of the pulses; and
   a control circuit for providing the one or more selection signals, wherein the control circuit generates the one or more selection signals according to an indication of a desired amplitude of the output signal, wherein the pulse width modulator comprises multiple switching circuits for generating the pulse-width modulated version of the output signal, wherein the control circuit is coupled to control inputs of each of the switching circuits for controlling switching of the switching circuits, wherein the switching circuits are coupled to corresponding ones of the multiple power supply inputs, wherein the control circuit disables switching of all except a selected one of the multiple switching circuits to select a corresponding one of the multiple amplitude levels for the pulses, and wherein a rate of the pulses generated by the pulse-width modulator is selected in conformity with the indication of the desired amplitude of the output signal.

2. The audio amplifier circuit of claim 1, further comprising:
   a power supply having an output coupled to one of the multiple power supply inputs of the pulse-width modulator; and
   a power source connected to an input of the power supply, and wherein another one of the multiple power supply inputs of the pulse-width modulator is connected to the power source, whereby an efficiency of the power supply does not affect the efficiency of the audio amplifier circuit when the another one of the multiple power supply inputs is selected.

3. The audio amplifier circuit of claim 1, wherein the power source is a battery.

4. The audio amplifier circuit of claim 1, further comprising a signal level detector having an input coupled to the audio input signal and an output coupled to the power supply for providing the indication of the amplitude of the output signal to the power supply, wherein the signal level detector determines the indication of the magnitude of the output signal from an amplitude of the audio input signal.

5. The audio amplifier circuit of claim 1, further comprising a gain-attenuation control circuit for adjusting a volume of the output signal in conformity with a volume control level, and wherein the power supply receives the indication of the amplitude of the output signal as a volume control level indication provided from the volume control level.

6. The audio amplifier circuit of claim 5, wherein the volume control level is a digital value provided to a digital control input of the gain-attenuation control circuit.

7. The audio amplifier circuit of claim 1, wherein the switching circuits comprise bridge switching circuits, comprising:
   a first switch that couples the corresponding power supply input to an output of the audio amplifier circuit; and
   a second switch that couples a corresponding power supply return to the output of the audio amplifier circuit, and wherein the control circuit disables at least one of the first switch or the second switch to deselect the corresponding one of the multiple amplitude levels.

8. The audio amplifier circuit of claim 1, wherein the second switch of all of the bridge switching circuits is provided by a same switching element, and wherein the second switch is not disabled by the control circuit to select among the multiple amplitude levels.

9. The audio amplifier circuit of claim 1, wherein a rate of the pulses generated by the pulse-width modulator is selected in conformity with the indication of the desired amplitude of the output signal.

10. The audio amplifier circuit of claim 9, wherein a lower rate of the pulses is selected when the selected one of the multiple power supply inputs is one of the multiple power supply inputs having a greater voltage and wherein a higher rate of the pulses is selected when the selected one of the multiple power supply inputs is the one of the multiple power supply inputs having a lower voltage.

* * * * *